United States Patent
Davis et al.

[11] Patent Number: 6,064,869
[45] Date of Patent: May 16, 2000

[54] SUPPRESSION OF NOISE BETWEEN PHASE LOCK LOOPS IN A SELECTIVE CALL RECEIVER AND METHOD THEREFOR

[75] Inventors: Darrell Eugene Davis, Sunrise; Scott Robert Humphreys, Boynton Beach, both of Fla.

[73] Assignee: Motorola, Inc., Schaumburg, Ill.

[21] Appl. No.: 09/033,011

[22] Filed: Mar. 2, 1998

[51] Int. Cl.[7] .................................................. H04Q 7/30
[52] U.S. Cl. .......................................... 455/260; 455/310
[58] Field of Search .................................. 455/260, 264, 455/265, 296, 310, 183.1, 183.2; 331/25, 34, 16–19, 177 R, 23; 375/376; 327/156

[56] References Cited

U.S. PATENT DOCUMENTS

| | | | |
|---|---|---|---|
| 4,271,434 | 6/1981 | Sakamoto | 455/164.1 |
| 5,081,705 | 1/1992 | Swanke | 455/260 |
| 5,179,729 | 1/1993 | Mishima et al. | 455/265 |
| 5,267,182 | 11/1993 | Wilke | 708/103 |
| 5,396,522 | 3/1995 | Laflin . | |
| 5,422,911 | 6/1995 | Barrett, Jr. et al. . | |
| 5,552,750 | 9/1996 | Barrett, Jr. et al. | 455/260 |
| 5,570,395 | 10/1996 | Myers | 375/346 |
| 5,572,168 | 11/1996 | Kasturia | 455/260 |
| 5,604,926 | 2/1997 | Pace et al. . | |
| 5,610,558 | 3/1997 | Mittel et al. | 455/260 |
| 5,745,843 | 4/1998 | Wetters et al. | 455/260 |
| 5,789,987 | 8/1998 | Mittel et al. | 331/17 |
| 5,811,998 | 9/1998 | Lundberg et al. | 327/156 |
| 5,852,728 | 12/1998 | Matsuda et al. | 713/501 |
| 5,966,644 | 10/1999 | Suzuki | 455/76 |

Primary Examiner—Dwayne D. Bost
Assistant Examiner—Jean A Gelin
Attorney, Agent, or Firm—Gregg Rasor

[57] ABSTRACT

A synthesizer (100) is used for generating a plurality of synthesized clock signals (128, 156). The synthesizer includes a clock source (102) for generating a common frequency reference signal (103), and a clock generator (104) coupled to the common frequency reference signal for generating a plurality of generated clock signals (106, 108), wherein each of the plurality of generated clock signals is offset from each other by a predetermined phase offset (189, 192). In addition, the synthesizer includes a plurality of PLLs (Phase Locked Loops) (166–168) for generating a selected one of the plurality of synthesized clock signals, wherein each of the plurality of PLLs is coupled to, and operates from, a corresponding one of the plurality of generated clock signals, and wherein the predetermined phase offset between each of the plurality of generated clock signals is known to suppress noise between the plurality of PLLs operating therefrom.

16 Claims, 5 Drawing Sheets

6,064,869

SUPPRESSION OF NOISE BETWEEN PHASE LOCK LOOPS IN A SELECTIVE CALL RECEIVER AND METHOD THEREFOR

FIELD OF THE INVENTION

This invention relates in general to phase lock loops, and particularly, to suppression of noise between phase lock loops in a selective call receiver and method therefor.

BACKGROUND OF THE INVENTION

Portable selective call receivers, such as pagers, typically use synthesizers including two or more PLLs (phase locked loops) for synthesizing frequencies necessary for the operation of a radio receiver included in the pager. In many applications, each PLL operates from a common clock source. Additionally, typically each PLL includes a set of digital frequency dividers used for controlling the programmable frequency of each PLL. In the case of a synthesizer including multiple PLLs, the frequency dividers of each PLL periodically reset at simultaneous intervals. The event of simultaneous reset of the frequency dividers causes each PLL to draw high levels of surge currents (e.g., 1–20 mA) from the power supply pins of the integrated circuit (IC) chip carrying the synthesizer. This high surge current in turn causes a voltage drop on the internal power supply traces of the IC, which in turn causes a modulation of the controlled oscillator of each PLL. This periodic distortion of the controlled oscillator causes the radio receiver of the pager to malfunction, thereby degrading the performance of the pager to receive messages, and under certain circumstances, rendering the pager inoperable.

FIGS. 1–3 show electrical block diagrams of prior art synthesizers with multiple phase locked loops (PLLs). FIG. 1 illustrates two PLLs 170–172 coupled to a power supply 174 by way of an external pin 176 of an IC. Also shown in FIG. 1, are the parasitic circuit elements generally associated with the layout of a circuit. Particularly, the parasitics consist of a network of inductances 174 and capacitances 176 some of which are internal to the synthesizer IC, and others which are caused by the layout of a PCB (printed circuit board). When a high surge current is experienced at the power supply lines 180 of the PLLs 170–172, the parasitics just described cause voltage drops that modulate the controlled oscillator of each of the PLLs 170–172. This distortion, as noted earlier, causes the controlled oscillators of each PLL 170–172 to generate distorted references frequencies, thereby causing the radio receiver of the pager to malfunction.

FIGS. 2–3 illustrate alternative embodiments used by prior art selective call receivers to resolve this problem. To minimize parasitic inductance, FIG. 2 illustrates a prior art method whereby the width of circuit traces internal and external to the IC are widened. Although this method helps to reduce voltage drops caused by surge currents on the power supply lines, it is disadvantageous in that it consumes a significant part of real-estate in the synthesizer IC, thereby increasing cost and reducing the amount of room available for other circuits. To further reduce distortion on the power supply lines, FIG. 3 illustrates an embodiment which builds on the embodiment depicted in FIG. 2. In this embodiment, each PLL 170–172 is designed to draw power from two or more supply pins, thereby reducing the amount of current drawn on the parasitic networks 182–184 of each pin and, consequently, minimizing modulation of the controlled oscillator of each of the PLLs 170–172. As was the case earlier, this method is costly and consumes even more real-estate than the embodiment of FIG. 2.

Accordingly, what is needed is a phase lock loop architecture that overcomes the foregoing disadvantages described in the prior art.

BRIEF DESCRIPTION OF THE DRAWINGS

The present invention is pointed out with particularity in the appended claims. However, other features of the invention will become more apparent and best understood by referring to the following detailed description in conjunction with the accompanying drawings in which:

DESCRIPTION OF THE PREFERRED EMBODIMENT

Figure 1:
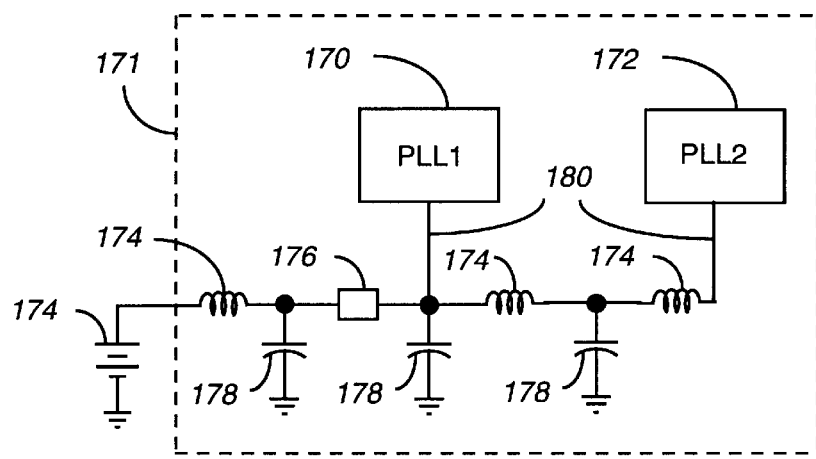
FIGS. 1–3 show electrical block diagrams of prior art synthesizers with multiple phase locked loops (PLLs)
Figure 2:
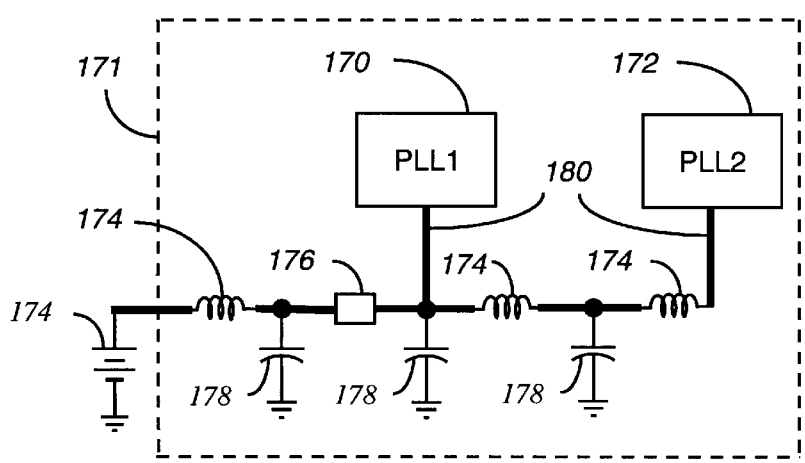
Figure 3:
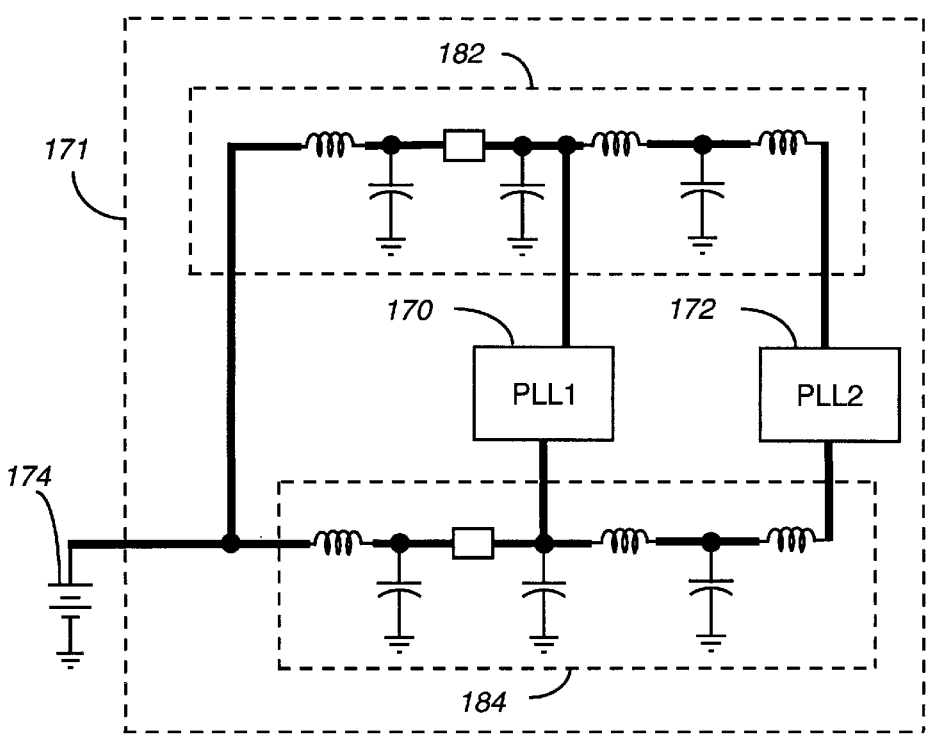
Figure 4:
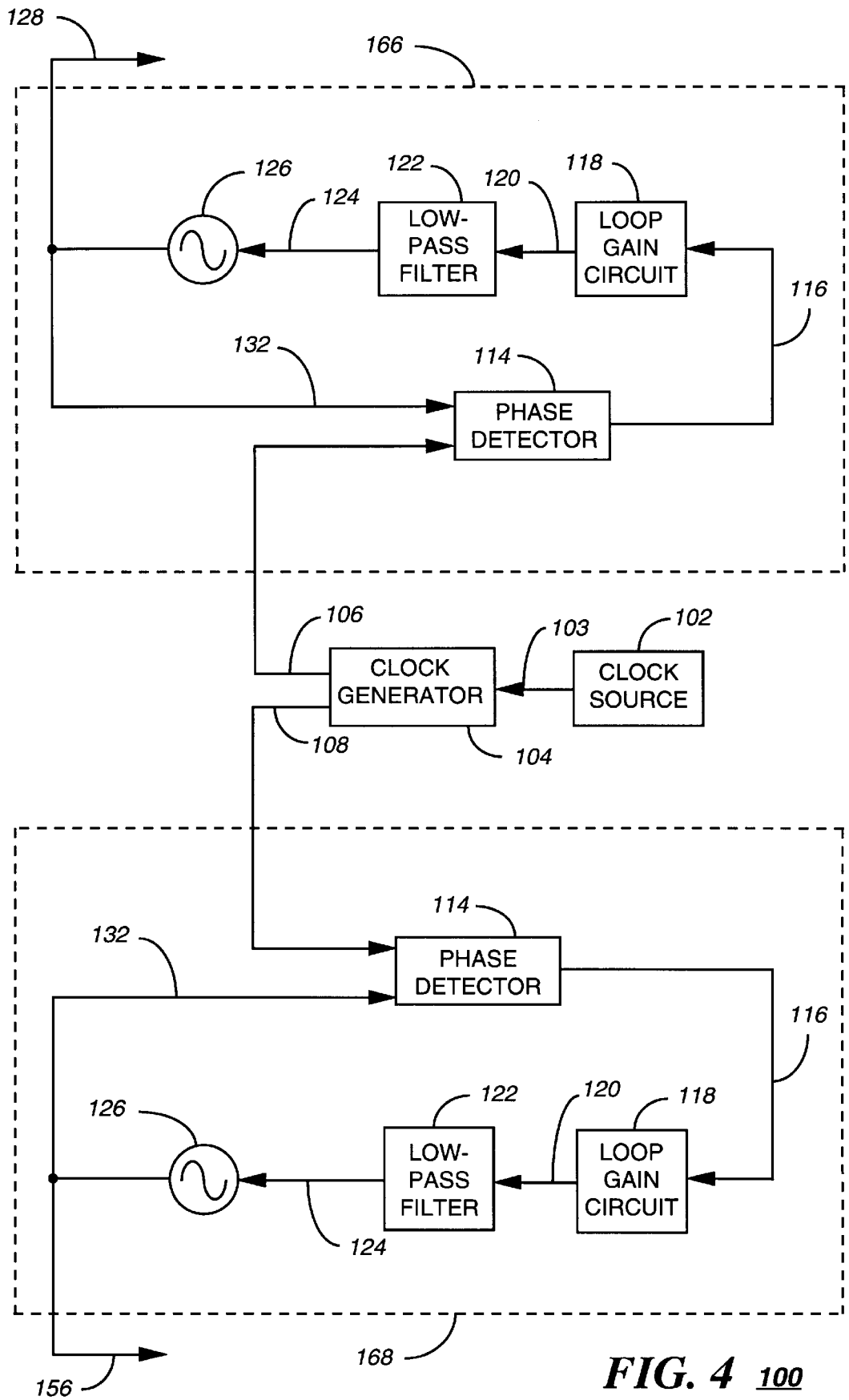
FIGS. 4–5 show alternative embodiments of an electrical block diagram of a synthesizer including a plurality of PLLs according to the present invention.
Figure 5:
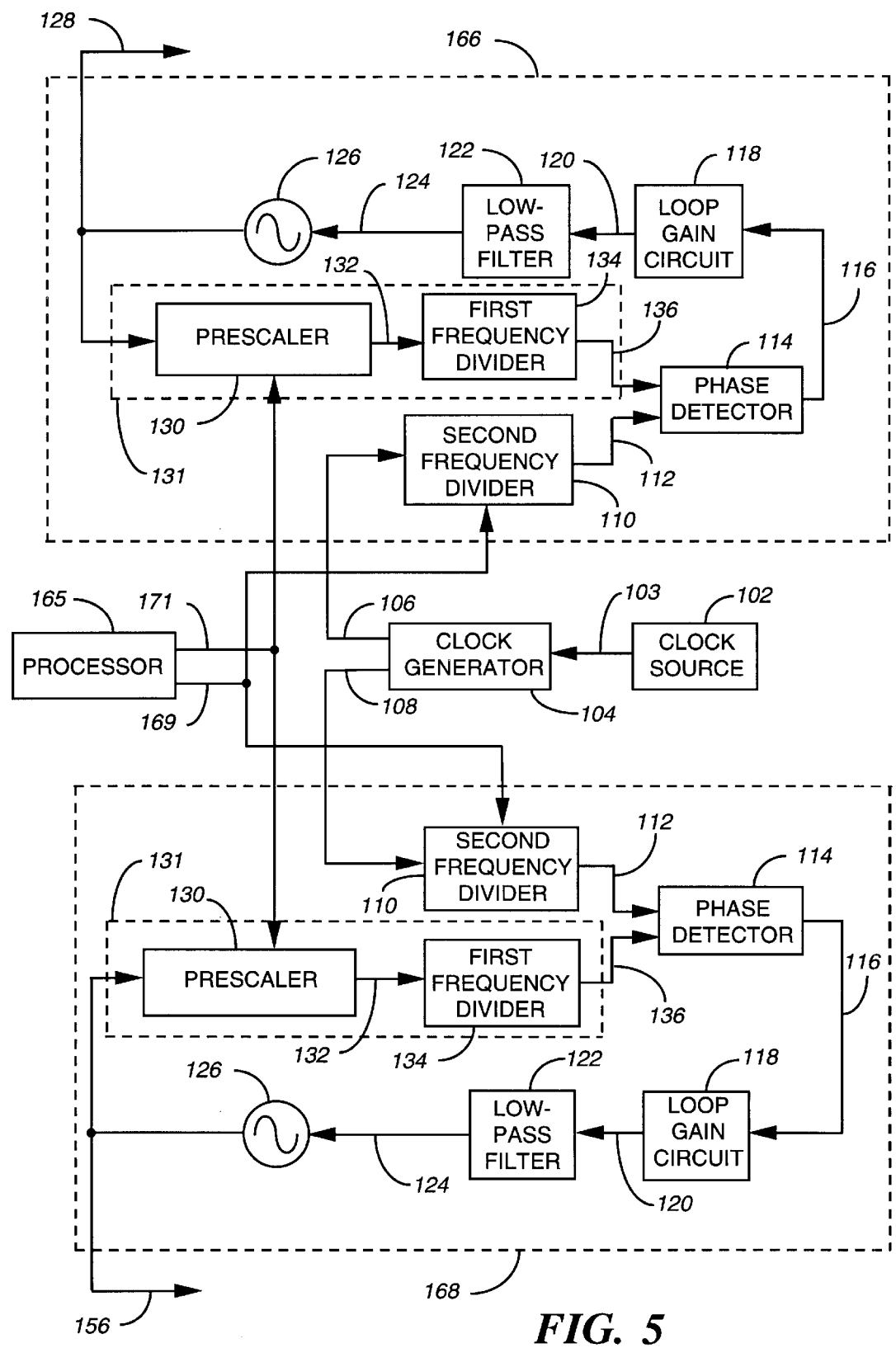

FIGS. 4–5 show alternative embodiments of an electrical block diagram of a synthesizer 100 including a plurality of PLLs 166–168 according to the present invention. In the first embodiment shown in FIG. 1, each of the PLLs 166–168 includes a phase detector 114, a loop gain circuit 118, a low-pass filter 122, and a controlled oscillator 126. To operate the circuitry of the synthesizer 100, a clock source 102 is coupled to a clock generator 104 whose outputs 106, 108 are coupled to an input of the phase detector 114 of each of the PLLs 166–168, respectively. The clock source 102 generates a common frequency reference signal 103 which is operated on by the clock generator 104 to generate clock signals 106, 108. The generated clock signals 106, 108 operate, for example, at the same frequency, and are offset from each other by a predetermined phase offset, e.g., 180° (see FIG. 6).

Each phase detector 114 utilizing a corresponding one of the generated clock signals 106, 108 as a clock reference for adjusting the output frequency of a selected one of the plurality of synthesized clock signals 128, 156 generated by the controlled oscillator 126. The phase detector 114 (which is preferably a conventional phase detector) maintains the a phase lock between its corresponding input signals by generating a phase error signal 116. The phase error signal 116 is then processed by the loop gain circuit 118 (which is preferably a conventional charge pump circuit). The loop gain circuit 118, which controls the loop gain of the PLL, generates an error correction signal 120, which is then filtered by the low-pass filter 122 in a conventional manner.

The low-pass filter 122 removes high frequency harmonics and noise from the error correction signal 120, thereby generating a filtered error correction signal 124. This signal sets the loop dynamics of the PLL. This is accomplished by adjusting the operating frequency of the selected one of the synthesized clock signals 128, 156 by way of the controlled oscillator 126. It will be appreciated that the filtered error correction signal 124 may comprise either a current control signal or a voltage control signal. In the case of a current control signal, the controlled oscillator 126 is preferably a current-controlled oscillator, whereas in the case of a voltage control signal, the controlled oscillator 126 is preferably a voltage-controlled oscillator.

Figure 6:
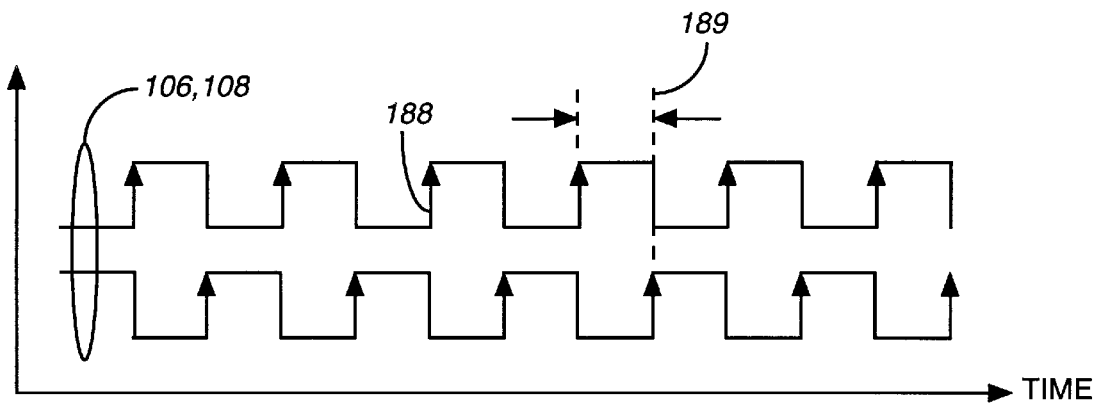
FIGS. 6–7 show timing diagrams of clocks used by the PLLs of FIG. 4 according to the present invention.

To substantially eliminate the effects described earlier in the prior art, the predetermined offset between the generated clock signals 106, 108 is chosen so that the clock transitions of each of the circuit elements of the respective PLLs 166–168 are offset from each other in a manner that guarantees only one PLL at a time draws a surge current from the power supply. FIG. 6 provides an illustration where the generated clock signals 106, 108 are offset from each other by a 180° phase offset. Assuming that the circuit elements of each PLL 166–168 operate from the rising edge 188 of their corresponding clock signals 106, 108, then each PLL 166–168 draws a surge current a short time after the rising edge 188 of each clock cycle.

As long as the surge current of one PLL settles before the next rising edge of the generated clock operating on the other PLL, the distortion effect of surge currents on the parasitic circuits coupled to the power supply signal discussed in the prior art is substantially, if not completely eliminated. In this example, the settling time between rising edges 188 of the generated clocks 106, 108 is half a clock cycle. Thus, there is a substantial amount time available for each of the PLLs 166–168 to settle, and thereby eliminate distortion on the power supply signal caused by surge currents. Based on this embodiment, the solutions used by prior art systems to reduce the distortion effects caused by surge currents are no longer necessary. Consequently, the present invention reduces cost and provides for better utilization of real-estate in the IC chip carrying the circuits of the synthesizer 100.

Figure 7:
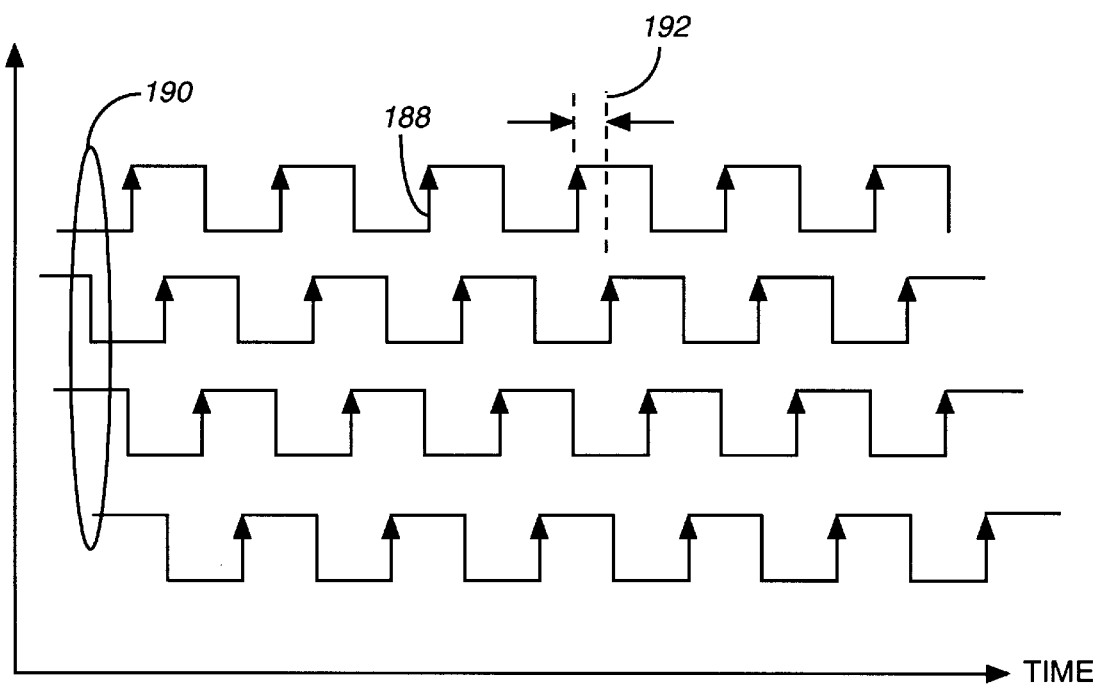

It will be appreciated that for situations involving a synthesizer with more than two PLLs, the use of a corresponding set of generated clocks each offset from each other by a predetermined phase offset will generate the same results as the two PLL embodiment described above. For example, for a synthesizer comprising four PLLs, four clocks, each operating at a predetermined phase offset from each other, would be utilized by the present invention. FIG. 7 illustrates an example of the configuration of these clocks. As shown in FIG. 7, each of the clocks 190 is offset from the other by a predetermined phase offset (in this case, one quarter of a clock cycle). As before, each of the four PLLs operates from a corresponding one of these clocks 190 and preferably from the rising edge 188 of the clock. In contrast to the clock scheme discussed in FIG. 6, the settling period 192 between operations of each of the PLLs is half that of the clock scheme described in FIG. 6. Although the settling period 192 is shorter than the settling period 189 described in FIG. 6, the benefits of the present invention are still achievable as long as the period of a surge current is less than the settling period 192.

In most application, this will be the case. For example, typical surge currents have a duration in the nanoseconds (e.g., 10–20 ns). With a clock operating at, e.g., 250 KHz, a clock cycle has a duration of 4000 ns. This provides ideally up to two hundred PLLs operating from a corresponding set of two hundred clocks offset from each other by 20 ns. In a practical application fewer clocks would be used (e.g., 190) to allow for some margin of error; however, this example illustrates that the present invention has a wide range of applicability.

In the examples presented above, it will be appreciated that the operating frequency of each of the generated clock signals 106, 108 could be the same as the operating frequency of the common frequency reference signal 103.

Hence, under this scenario the clock generator 104 operates as a conventional delay circuit that generates a plurality of clock signals 106, 108 offset from each other by a predetermined phase offset. It will be appreciated that, alternatively, the clock generator 104 may generate a plurality of clocks operating at different frequencies offset from each other at a predetermined phase offset. For the clocks illustrated in FIG. 6, the clock generator 104 may simply comprise a direct connection between one of the PLLs 166–168 and the common frequency reference signal 103 representative of one of the generated clock signals 106, 108, and a logic inverter coupled to the common frequency reference signal 103 for generating an inverted version of the common frequency reference signal 103 representative of the other generated clock signal. It should be appreciated by one of ordinary skill in the art that any conventional method suitable to the present invention for delaying clock signals or for generating clock signals having a predetermined phase offset between each other may be utilized for the clock generator 104 of FIG. 4.

FIG. 5 illustrates an alternative embodiment that is substantially similar to the one described in FIG. 4. In this embodiment the synthesizer 100 comprises, in addition to the embodiment shown in FIG. 4, two PLLs 166–168 with programmable synthesized clock signals 128, 156. To generate a programmable synthesized clock signals 128, 156, each PLL comprises a loop frequency divider 131 and a second frequency divider 110. The loop frequency divider 131 preferably comprises a prescaler 130, which is a conventional prescaler programmable by way of a conventional processor 165 through a first control bus 171, and a first frequency divider 134. The processor 165 is preferably a circuit element of a selective call receiver or transceiver, which will be discussed shortly. It will be appreciated that, alternatively, the loop frequency divider 131 may comprise a conventional dual-modulus prescaler, which may require a frequency divider in addition to the first frequency divider.

The prescaler 130 is, for example, a high-speed digital circuit that divides a corresponding one of the synthesized clock signals 128, 156 by a factor of, e.g., 2, 4 or 16. Selecting one of these factors is programmable by way of the first control bus 171. The first and second frequency dividers 134, 110 are conventional digital circuits for dividing down the frequency of their respective clock inputs. The first frequency divider 134 divides down the prescaler frequency signal 132, and in turn generates a first frequency signal 136 therefrom. The second frequency divider 110 is coupled to a corresponding one of the generated clock signals 106, 108 for generating a second frequency signal 112. Additionally, each of the second frequency dividers 110 is coupled to a second control bus 169, which provides for a programmable division of the operating clock frequency of the second frequency signal 112.

With the capability of programming the operating frequency of the second frequency signal 112, the synthesized clock signal of each PLL may be programmed to operate at different frequencies. As was described earlier for the embodiment shown in FIG. 4, the phase detector 114 is used for determining the phase difference between its respective inputs. In this embodiment, the phase detector 114 determines the phase difference between the first and second frequency signals, and adjusts the operating frequency of the controlled oscillator 126 to compensate for any phase error detected.

As one might expect, the embodiment shown in FIG. 5 includes a substantial number of more circuit elements than the embodiment shown in FIG. 4. As a result, the surge current drawn by each of the PLLs 166–168 of FIG. 5 is greater than the surge current of the PLLs 166–168 shown in FIG. 4. The present invention, however, is applicable to this embodiment. As before, by offsetting the generated clock signals 106, 108 from each other by a predetermined phase offset greater than the settling time of the surge current, the distortion effects experienced by prior art systems may be substantially eliminated, thereby averting the need for applying the solutions used by the prior art. The descriptions for the timing diagrams illustrated in FIGS. 6–7 are applicable to the present embodiment, and for this reason, will not be discussed further.

Figure 8:
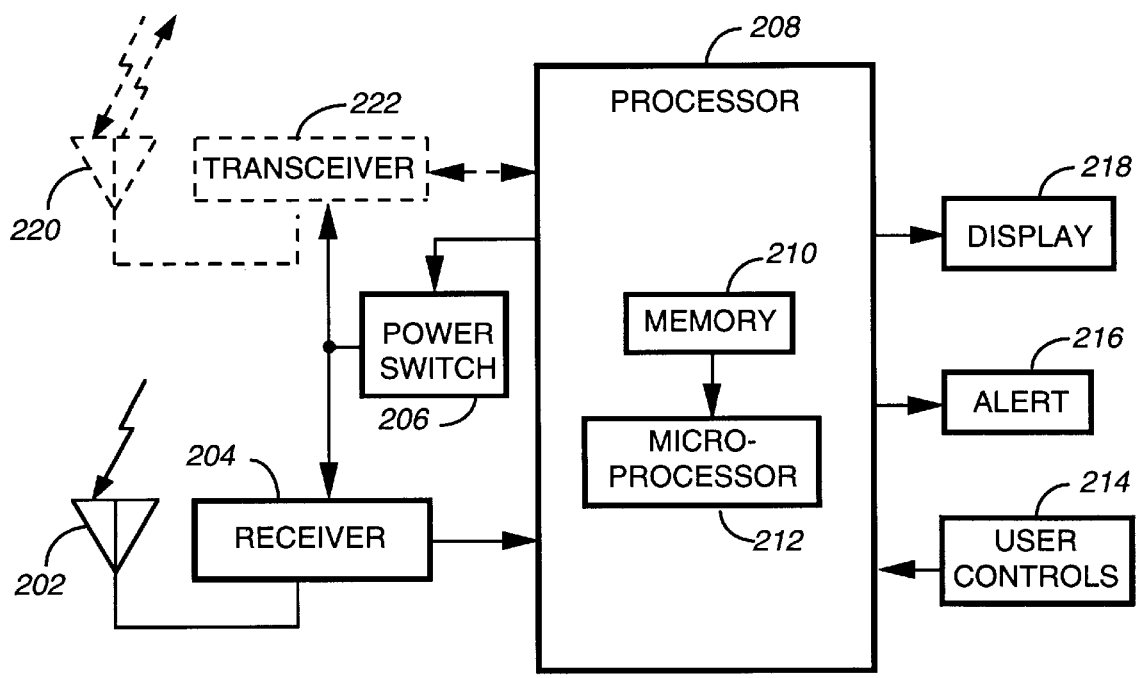
FIG. 8 shows an electrical block diagram of a SCR (selective call receiver) or, alternatively, a SCT (selective call transceiver) utilizing any one of the foregoing embodiments shown in FIGS. 4–5 according to the present invention.

FIG. 8 shows an electrical block diagram 200 of a SCR (selective call receiver) or, alternatively, a SCT (selective call transceiver) utilizing any one of the foregoing embodiments shown in FIGS. 4–5 according to the present invention. The SCR comprises an antenna 202 for intercepting RF signals from, for example, a radio communication system (not shown). The antenna 202 is coupled to a receiver 204 employing conventional demodulation techniques for receiving the communication signals transmitted by the radio communication system. The receiver preferably utilizes a selected one of the embodiments of the synthesizer 100 shown in FIGS. 4–5 for operating the circuits of the receiver 204. Radio signals received by the receiver 204 produce demodulated information, which is coupled to a processor 208 for processing received messages. The processor 208 in addition performs the function of programming the prescaler 130 and the second frequency divider 110 as described for the embodiment shown in FIG. 5. A conventional power switch 206, coupled to the processor 208, is used to control the supply of power to the receiver 204, thereby providing a battery saving function.

To perform the necessary functions of the SCR, the processor 208 includes a microprocessor 212, and a memory 210 that includes a random access memory (RAM), a read-only memory (ROM), and an electrically erasable programmable read-only memory (EEPROM). Preferably, the processor 208 is similar to the M68HC08 microcontroller manufactured by Motorola, Inc. It will be appreciated that other similar processors can be utilized for the processor 208, and that additional processors of the same or alternative type can be added as required to handle the processing requirements of the processor 208.

The processor 208 is programmed by way of the ROM to process incoming messages transmitted by the radio communication system. The processor 208 decodes an address in the demodulated data of the received message, compares the decoded address with one or more addresses stored in the EEPROM, and when a match is detected, proceeds to process the remaining portion of the message. Once the processor 208 has processed the message, it stores the message in the RAM, and a call alerting signal is generated to alert a user that a message has been received. The call alerting signal is directed to a conventional audible or tactile alerting device 216 for generating an audible or tactile call alerting signal.

The message can be accessed by the user through user controls 214, which provide functions such as lock, unlock, delete, read, etc. More specifically, by the use of appropriate functions provided by the user controls 214, the message is recovered from the RAM, and conveyed to the user by way of a display 218 (e.g., a conventional liquid crystal display (LCD)). It will be appreciated that, alternatively, the display 218 can be accompanied by an audio circuit (not shown) for conveying voice messages also.

Alternatively, the SCT utilizes a transceiver 222 and a corresponding transceiver antenna 220 (both shown with phantom lines). Each of these elements comprises conventional circuits for transmitting and receiving radio signals to and from a radio communication system. Preferably, the circuits of the transceiver 222 utilize a selected one of the embodiments of the synthesizer 100 shown in FIGS. 4–5 for operating its circuits. In this embodiment, the processor 208 performs the additional function of constructing messages to transmit to the radio communication system. The process of receiving and processing messages is substantially similar to the functions described for the SCR above.

The embodiments of the present invention shown in FIGS. 4–5 are preferably employed in the manufacture of the SCR and the SCT. These embodiments provide the advantage of preventing the radio circuits of the SCR and the SCT from malfunctioning due to surge currents occurring therein. As a result, the present invention reduces the cost of manufacturing SCRs and SCTs, and based on its simplicity, improves the quality of manufacture of the same.

Although the invention has been described in terms of a preferred embodiment it will be obvious to those skilled in the art that many alterations and variations may be made without departing from the invention. Accordingly, it is intended that all such alterations and variations be considered as within the spirit and scope of the invention as defined by the appended claims.

What is claimed is:

1. In a plurality of PLLs (Phase Locked Loops), a method for suppressing noise between the plurality of PLLs, comprising:

generating a common frequency reference signal from a clock source;

generating a plurality of clock signals from the common frequency reference signal, wherein each of the plurality of clock signals is offset from each other by a predetermined phase offset known to suppress noise between the plurality of PLLs; and operating each of the plurality of PLLs from a corresponding one of the plurality of clock signals.

2. A synthesizer for generating a plurality of synthesized clock signals, comprising:

a clock source for generating a common frequency reference signal;

a clock generator coupled to the common frequency reference signal for generating a plurality of generated clock signals, wherein each of the plurality of generated clock signals is offset from each other by a predetermined phase offset; and a plurality of PLLs (Phase Locked Loops) for generating a selected one of the plurality of synthesized clock signals, wherein each of the plurality of PLLs is coupled to, and operates from, a corresponding one of the plurality of generated clock signals, and wherein the predetermined phase offset between each of the plurality of generated clock signals is known to suppress noise between the plurality of PLLs operating therefrom.

3. The synthesizer as recited in claim 2, wherein the plurality of generated clock signals operate at the same frequency as the common frequency reference signal.

4. The synthesizer as recited in claim 2, wherein each of the plurality of PLLs comprises:

a loop frequency divider coupled to the selected one of the plurality of synthesized clock signals for generating a first frequency signal;

a second frequency divider coupled to the corresponding one of the plurality of generated clock signals for generating a second frequency signal;

a phase detector coupled to the first and second frequency signals for generating a phase error signal;

a loop gain circuit coupled to the phase error signal for generating an error correction signal;

a filter coupled to the error correction signal for generating a filtered error correction signal; and a controlled oscillator coupled to the filtered error correction signal for generating the selected one of the plurality of synthesized clock signals.

5. The synthesizer as recited in claim 4, wherein the loop frequency divider comprises:

a prescaler coupled to the selected one of the plurality of synthesized clock signals for generating a prescaler frequency signal; and a first frequency divider coupled to the prescaler frequency signal for generating the first frequency signal.

6. The synthesizer as recited in claim 4, wherein the filter comprises a low-pass filter.

7. The synthesizer as recited in claim 2, wherein each of the plurality of PLLs comprises:

a phase detector coupled to the selected one of the plurality of synthesized clock signals and the corresponding one of the plurality of generated clock signals for generating a phase error signal;

a loop gain circuit coupled to the phase error signal for generating an error correction signal;

a filter coupled to the error correction signal for generating a filtered error correction signal; and a controlled oscillator coupled to the filtered error correction signal for generating the selected one of the plurality of synthesized clock signals.

8. The synthesizer as recited in claim 7, wherein the filter comprises a low-pass filter.

9. A selective call receiver comprising the synthesizer of claim 2.

10. The selective call receiver as recited in claim 9, wherein the frequency of each of the plurality of synthesized clock signals generated by the synthesizer is programmable by a processor of the selective call receiver.

11. The selective call receiver as recited in claim 10, wherein each of the plurality of PLLs comprises:

a phase detector coupled to the selected one of the plurality of synthesized clock signals and the corresponding one of the plurality of generated clock signals for generating a phase error signal;

a loop gain circuit coupled to the phase error signal for generating an error correction signal;

a filter coupled to the error correction signal for generating a filtered error correction signal; and a controlled oscillator coupled to the filtered error correction signal for generating the selected one of the plurality of synthesized clock signals.

12. The selective call receiver as recited in claim 11, wherein the filter comprises a low-pass filter.

13. A selective call transceiver comprising the synthesizer of claim 2.

14. The selective call transceiver as recited in claim 13, wherein the frequency of each of the plurality of synthesized clock signals generated by the synthesizer is programmable by a processor of the selective call transceiver.

15. The selective call transceiver as recited in claim 14, wherein each of the plurality of PLLs comprises:

a phase detector coupled to the selected one of the plurality of synthesized clock signals and the corresponding one of the plurality of generated clock signals for generating a phase error signal;

a loop gain circuit coupled to the phase error signal for generating an error correction signal;

a filter coupled to the error correction signal for generating a filtered error correction signal; and a controlled oscillator coupled to the filtered error correction signal for generating the selected one of the plurality of synthesized clock signals.

16. The selective call transceiver as recited in claim 15, wherein the filter comprises a low-pass filter.

\* \* \* \* \*